US010361195B2

(12) United States Patent
Sengupta et al.

(10) Patent No.: US 10,361,195 B2
(45) Date of Patent: Jul. 23, 2019

(54) SEMICONDUCTOR DEVICE WITH AN ISOLATION GATE AND METHOD OF FORMING

(71) Applicants: Rwik Sengupta, Austin, TX (US); Mark S. Rodder, Dallas, TX (US)

(72) Inventors: Rwik Sengupta, Austin, TX (US); Mark S. Rodder, Dallas, TX (US)

(73) Assignee: Samsung Electronics Co., Ltd. (KR)

( * ) Notice: Subject to any disclaimer, the term of this patent is extended or adjusted under 35 U.S.C. 154(b) by 115 days.

(21) Appl. No.: 14/834,419

(22) Filed: Aug. 24, 2015

(65) Prior Publication Data
US 2016/0071848 A1    Mar. 10, 2016

Related U.S. Application Data

(60) Provisional application No. 62/045,735, filed on Sep. 4, 2014.

(51) Int. Cl.
*H01L 27/088* (2006.01)
*H01L 29/06* (2006.01)
(Continued)

(52) U.S. Cl.
CPC .. *H01L 27/0886* (2013.01); *H01L 21/823418* (2013.01); *H01L 21/823431* (2013.01); *H01L 21/823475* (2013.01); *H01L 21/823481* (2013.01); *H01L 27/0207* (2013.01); *H01L 27/088* (2013.01); *H01L 29/0642* (2013.01); (Continued)

(58) Field of Classification Search
CPC ............. H01L 27/0207; H01L 29/0642; H01L 29/0847; H01L 27/088; H01L 21/823481; H01L 21/823418; H01L 21/823475; H01L 21/823431; H01L 21/823437
See application file for complete search history.

(56) References Cited

U.S. PATENT DOCUMENTS 7,282,409 B2 * 10/2007 Mouli .................. H01L 21/765
257/E21.574
7,663,237 B2 * 2/2010 Peng ................. H01L 21/76895
257/750

(Continued)

FOREIGN PATENT DOCUMENTS

EP            1641045 A2    3/2006

*Primary Examiner* — Latanya N Crawford
(74) *Attorney, Agent, or Firm* — Renaissance IP Law Group LLP

(57) ABSTRACT

An embodiment includes a semiconductor device, comprising: a substrate; a continuous diffusion region disposed on the substrate; a first gate structure disposed on the continuous diffusion region; a second gate structure disposed on the continuous diffusion region; an isolation gate structure disposed between the first gate structure and the second gate structure and disposed adjacent to the both the first gate structure and the second gate structure; a first diffusion region of the continuous diffusion region disposed between the first gate structure and the isolation gate structure; a second diffusion region of the continuous diffusion region disposed between the second gate structure and the isolation gate structure; a conductive layer disposed on the first and second diffusion regions; and an isolation gate contact disposed over the isolation gate structure and electrically insulated from the first diffusion region.

9 Claims, 7 Drawing Sheets

(51) Int. Cl.
  *H01L 29/08* (2006.01)
  *H01L 21/8234* (2006.01)
  *H01L 27/02* (2006.01)

(52) U.S. Cl.
  CPC .. *H01L 29/0847* (2013.01); *H01L 21/823437* (2013.01)

(56) References Cited

U.S. PATENT DOCUMENTS

| | | | |
|---|---|---|---|
| 8,218,352 B2 | 7/2012 | Asayama | |
| 8,324,668 B2* | 12/2012 | Huang | H01L 21/28123 257/288 |
| 8,338,864 B2 | 12/2012 | Katakura | |
| 8,609,510 B1 | 12/2013 | Banna et al. | |
| 8,782,576 B1 | 7/2014 | Bowers et al. | |
| 2005/0287739 A1* | 12/2005 | Mouli | H01L 21/765 438/257 |
| 2009/0121357 A1* | 5/2009 | Toomey | H01L 21/76895 257/758 |
| 2010/0117120 A1* | 5/2010 | Yamashita | H01L 21/823425 257/206 |
| 2010/0127333 A1 | 5/2010 | Hou et al. | |
| 2011/0147765 A1* | 6/2011 | Huang | H01L 21/28123 257/77 |
| 2012/0126336 A1* | 5/2012 | Anderson | H01L 21/765 257/392 |
| 2012/0223392 A1* | 9/2012 | Okada | H01L 27/11803 257/369 |
| 2013/0082309 A1* | 4/2013 | Su | H01L 29/66636 257/288 |
| 2014/0001563 A1* | 1/2014 | Rashed | H01L 27/0207 257/369 |
| 2014/0124868 A1* | 5/2014 | Kamal | H01L 27/0207 257/369 |
| 2014/0138750 A1* | 5/2014 | Wu | H01L 29/66477 257/288 |
| 2014/0264610 A1* | 9/2014 | Yang | H01L 29/6681 257/368 |
| 2014/0264629 A1* | 9/2014 | Zhu | H01L 23/528 257/401 |
| 2014/0374805 A1* | 12/2014 | Wu | H01L 21/311 257/288 |
| 2015/0091103 A1* | 4/2015 | Su | H01L 29/66636 257/401 |
| 2015/0235948 A1* | 8/2015 | Song | H01L 23/5283 257/368 |

* cited by examiner

SEMICONDUCTOR DEVICE WITH AN ISOLATION GATE AND METHOD OF FORMING

CROSS-REFERENCE TO RELATED APPLICATIONS

This application claims the benefit of U.S. Provisional Patent Application No. 62/045,735, filed Sep. 4, 2014, which is hereby incorporated by reference herein, in its entirety, for all purposes.

BACKGROUND

This disclosure relates to semiconductor devices and, in particular, semiconductor devices with isolation gates.

Standard cell logic gates made of semiconductor devices may be scaled to increase chip density. In addition, different cell layouts may be used to further increase chip density. However, adjacent transistors should be electrically isolated from one another. To isolate adjacent transistors, a break in a diffusion region may be used with a dummy gate region. Such a structure may require a separation of one or two times a contacted poly pitch of the semiconductor device. This distance limits the minimum spacing between transistors and hence, minimum cell size.

SUMMARY

An embodiment includes a semiconductor device, comprising: a substrate; a continuous diffusion region disposed on the substrate; a first gate structure disposed on the continuous diffusion region; a second gate structure disposed on the continuous diffusion region; an isolation gate structure disposed between the first gate structure and the second gate structure and disposed adjacent to the both the first gate structure and the second gate structure; a first diffusion region of the continuous diffusion region disposed between the first gate structure and the isolation gate structure; a second diffusion region of the continuous diffusion region disposed between the second gate structure and the isolation gate structure; a conductive layer disposed on the first and second diffusion regions; and an isolation gate contact disposed over the isolation gate structure and electrically insulated from the first diffusion region.

An embodiment includes a semiconductor device, comprising: a substrate; a continuous diffusion region disposed on the substrate; a first gate structure disposed on the continuous diffusion region; a second gate structure disposed on the continuous diffusion region; an isolation gate structure disposed between the first gate structure and the second gate structure and disposed adjacent to the both the first gate structure and the second gate structure; a first diffusion region of the continuous diffusion region disposed between the first gate structure and the isolation gate structure; a second diffusion region of the continuous diffusion region disposed between the second gate structure and the isolation gate structure; and an isolation gate contact disposed over the isolation gate structure and electrically insulated from each of the first and second diffusion regions.

An embodiment includes a method, comprising: forming a continuous diffusion region on a substrate; forming an isolation gate structure on the continuous diffusion region; forming a conductive layer on sides of the isolation gate structure; forming source/drain contacts on the conductive layer; and forming an isolation gate contact on the isolation gate structure; wherein the isolation gate contact is electrically insulated from at least one of the source/drain contacts.

DETAILED DESCRIPTION

Figure 1:
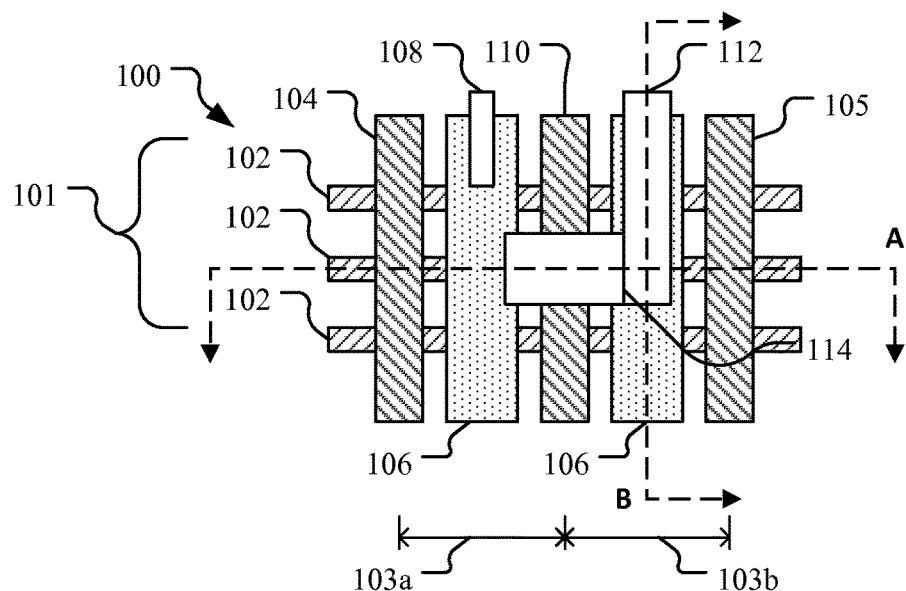
FIG. 1 is a plan view of a semiconductor device according to an embodiment.

The embodiments relate to semiconductor devices and, in particular, semiconductor devices with isolation gates. The following description is presented to enable one of ordinary skill in the art to make and use the embodiments and is provided in the context of a patent application and its requirements. Various modifications to the embodiments and the generic principles and features described herein will be readily apparent. The embodiments are mainly described in terms of particular methods and devices provided in particular implementations.

However, the methods and devices will operate effectively in other implementations. Phrases such as "an embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of this disclosure. The embodiments will also be described in the context of particular methods having certain steps. However, the methods may operate according to other methods having different and/or additional steps and steps in different orders that are not inconsistent with the embodiments. Thus, embodiments are not intended to be limited to the particular embodiments shown, but are to be accorded the widest scope consistent with the principles and features described herein.

The embodiments are described in the context of particular devices having certain components. One of ordinary skill in the art will understand that in other embodiments, the devices may have other and/or additional components and/or other features. One of ordinary skill in the art will also readily recognize that the method and devices are described in the context of a structure having a particular relationship to a substrate. However, one of ordinary skill in the art will readily recognize that the method and system are consistent with other structures. In addition, one of ordinary skill in the art will readily recognize that the layers could have another structure. Methods and devices may also be described in the context of single elements. However, one of ordinary skill in the art will readily recognize that the methods and devices are consistent with the use of devices having multiple elements.

It will be understood by those skilled in the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. Furthermore, in those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In the accompanying drawings, various layers, structures, dimensions, or the like are illustrated in an idealized manner to aid in explaining aspects of various embodiments. However, in other embodiments, modifications of the illustrated shapes may be expected according to manufacturing technologies and/or tolerances. Therefore, embodiments should not be construed as being limited to specific shapes of the illustrated regions. The shapes may be changed during the manufacturing processes. Furthermore, various relationships may be described as being substantially the same, substantially equal, or the like. As used herein, "substantially" includes not only relationships that are exactly equal, but also those that are equal within manufacturing technologies and/or tolerances.

Figure 2:
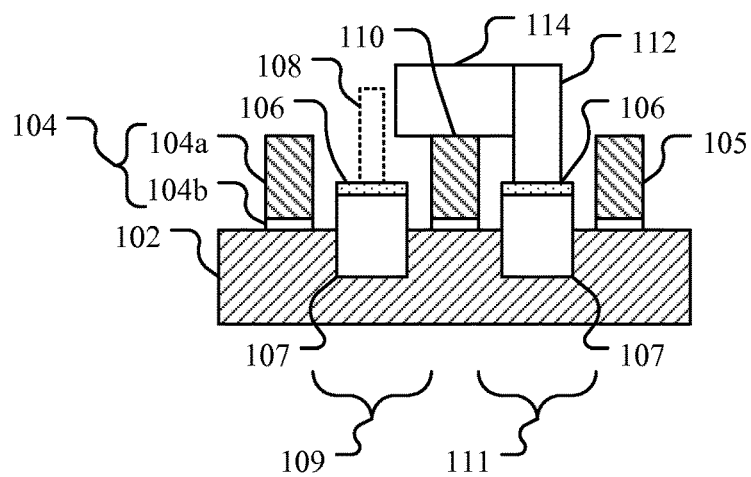
FIGS. 2 and 3 are cross-sectional views of the semiconductor device of FIG. 1.
Figure 3:
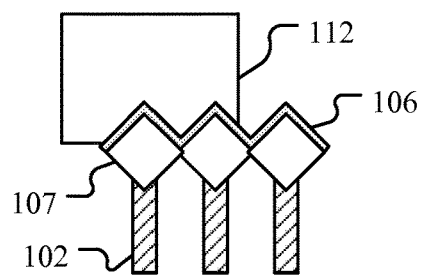

FIG. 1 is a plan view of a semiconductor device 100 according to an embodiment. FIGS. 2 and 3 are cross-sectional views of the semiconductor device of FIG. 1 along planes A and B, respectively. Referring to FIGS. 1-3, in an embodiment, a semiconductor device 100 includes a continuous diffusion region 101 disposed on a substrate. For clarity, the substrate is not illustrated. In this embodiment, the continuous diffusion region 101 includes multiple fins 102; however, in other embodiments, the continuous diffusion region 101 may have different structures. For example, diffusion regions of planar FETs, finFETs, GAA nanowire FETs, any other horizontal MOSFET channel scheme with source/drain/gate terminals, or the like may be part of the semiconductor device.

First and second gate structures 104 and 105 are disposed on the continuous diffusion region 101. The gate structures 104 and 105 may include multiple stacked layers, such as a gate insulating layer, a gate electrode, capping pattern, or the like. For example, the gate structure 104 includes a gate electrode 104a and a gate insulating layer 104b. Gate structure 105 may have similar layers; however, for clarity, the layers are not individually identified. The first and second gate structures 104 and 105 may be gates of transistors in a logic device.

An isolation gate structure 110 is disposed on the continuous diffusion region 101. The isolation gate structure 110 is disposed between the first gate structure 104 and the second gate structure 105 and disposed adjacent to the both the first gate structure 104 and the second gate structure 105. The isolation gate structure 110 may have a form and/or layers that are similar to the first and second gate structures 104 and 105; however, in other embodiments, the isolation gate structure 110 may be different from one or both of the first and second gate structure 104 and 105.

In an embodiment, one or both of the spacing 103a of the first gate structure 104 to the isolation gate structure 110 and the spacing 103b of the second gate structure 105 to the isolation gate structure 110 may be substantially equal to a contacted poly pitch (CPP) of the semiconductor device 100, where the CPP is the minimum pitch of contacted gates.

Source/drain regions of transistors may be disposed on sides of the gate structures 104. For example, a first diffusion region 109 of the continuous diffusion region 101 may be disposed between the first gate structure 104 and the isolation gate structure 110. A second diffusion region 111 of the continuous diffusion region 102 may be disposed between the second gate structure 105 and the isolation gate structure 110. The first diffusion region 109 and the second diffusion region 111 may form source/drain regions of different transistors.

In this embodiment, a silicide layer 106 is disposed on the first and second diffusion regions. In particular, the silicide layer 106 is disposed on source/drain 107 in the first and second diffusion regions 109 and 111. Contacts 108 and 112 are disposed on the silicide layers in the diffusion regions 109 and 111, respectively. The contacts 108 and 112 may be partial contacts. Thus, the contacts 108 and 112 may not extend across the entire corresponding diffusion region 109 or 111. Although silicide has been used as an example, any conductive layer including a metal alloy may be used.

Although the source/drain 107 has been illustrated as having a merged diamond cross-section, in other embodiments, the source/drain 107 may have other shapes and/or be unmerged. For example, a cross-section of the source/drain 107 may be rectangular, pentagonal, hexagonal, ellipsoidal, or the like. For an example of source/drain 107 being unmerged, a silicide layer 106 and/or any conductive layer including a metal alloy may be further contiguous to surfaces not only including the substantially top portions of source/drain 107 but also including the substantially edge or bottom portions of source/drain 107 and/or insulator regions in-between the unmerged source/drain 107, in order to similarly form a continuous conductive region connecting all of source/drain 107.

An isolation gate contact 114 is disposed over the isolation gate structure 110 and is electrically insulated from at least one of the diffusion regions 109 and 111. In this embodiment, the isolation gate contact 114 is electrically insulated from the first diffusion region 109. However, the isolation gate contact 114 is electrically connected to the contact 112. In particular, the isolation gate contact 114 may contact the contact 112. For example, in this embodiment, the contact 112 is wider than contact 108. As a result, an electrical connection between the isolation gate contact 114 and the contact 112 is made. Contact 112 may be formed with a width sufficient to contact the isolation gate contact 114.

In this embodiment, when the isolation gate structure 110 is biased appropriately, the diffusion regions 109 and 111 may be electrically isolated. For example, a power or ground voltage may be applied to the diffusion region 111 through the contact 112. This voltage may be an appropriate voltage to turn off a channel beneath the isolation gate 110. For example, for NMOS, it may be connected to zero potential and for PMOS, to a power supply. The isolation gate contact 114 is electrically connected to the contact 112 and thus, the voltage is applied to the isolation gate structure 110, turning off the channel.

Although the isolation gate structure 110 has been described as being electrically connected to an adjacent diffusion region 111, as will be described in further detail below, the isolation gate contact 114 may be electrically insulated from both the diffusion regions 109 and 111.

In an embodiment, the continuous diffusion region 101 may reduce a chance of strain relaxation and/or un-landed contacts. In particular, a chance of such conditions may be reduced relative to a semiconductor device using single or double diffusion breaks.

In an embodiment, a number of diffusion breaks between same type of transistor with unshared source/drains may be reduced to zero. In particular, this may be accomplished by using the continuous diffusion region 101 as the source/drain for adjacent transistors. In particular, in some semiconductor devices, the contact to each of the source/drain regions 109 and 111 may include a trench contact crossing over all of the source/drain regions 109 and 111 associated with multiple fins 102 of a given device, i.e. a 'full contact'. When a cell is scaled, process margin may be insufficient to prevent an inadvertent electrical connection between such a trench contact and the isolation gate structure 110. In addition, routing congestion may make connection of the isolation gate structure 110 to a power rail directly more difficult.

Accordingly, in an embodiment, partial contacts may be used in place of a trench contact overlapping the entire diffusion region 109 or 111. The partial contact may include a blanket silicide source/drain with partial contacts, such as contact 108. Connection to the isolation gate structure 110 may now be formed on the active region of the MOSFET device with a reduced if not eliminated chance of an unintentional electrical connection between the isolation gate structure 110 and the adjacent diffusion regions 109 and 111.

In this embodiment, a length of the contact 108 may not extend along the entire length of the diffusion region 109. In particular, the contact 108 may extend such that an end of the contact is separated from the isolation gate contact 114 by a distance that is greater than or equal to a required process margin. As a result, an electrical connection between the isolation gate contact 114 and the contact 108, and hence the diffusion region 109, may be eliminated. As illustrated in FIG. 2, contact 108 is illustrated with dashed lines to show the relationship of the contact 108 and the isolation gate contact 114, even though the contact 108 does not appear in the cross-section of FIG. 2. As can be seen, had contact 108 been proximate to the isolation gate contact 114, an unintended contact may be formed.

In an embodiment, the isolation gate structure 110 may include a gate stack material that may result in a higher magnitude of a threshold voltage for an isolation gate separating diffusion regions 109 and 111. Since the isolation gate structure 110 may be biased to always be off, additional implant or larger gate length may be used to increase its threshold voltage to be higher than the transistors on either side.

Figure 4:
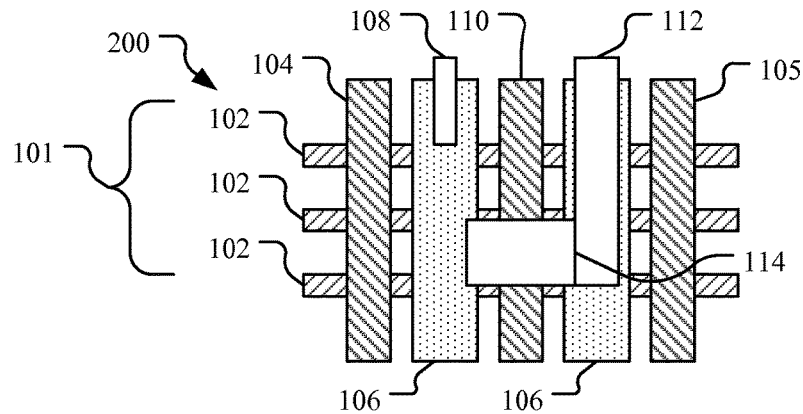
FIGS. 4-6 are plan views of semiconductor device according to various embodiments.
Figure 5:
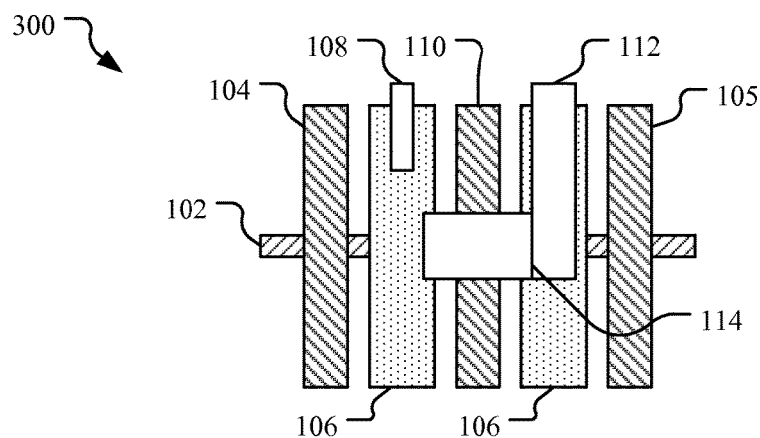
Figure 6:
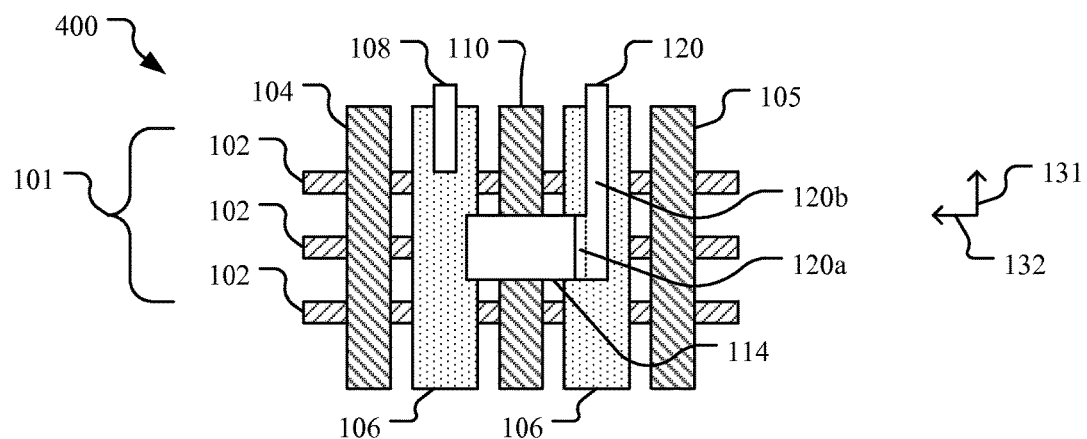

FIGS. 4-6 are plan views of semiconductor device according to various embodiments. Referring to FIG. 4, in this embodiment, the semiconductor device 200 has structures similar to the semiconductor device 100 of FIG. 1. However, the isolation gate contact 114 is not disposed directly over a fin 102. Here, the isolation gate contact 114 may be disposed between fins 102. Furthermore, in other embodiments, the isolation gate contact 114 may be disposed in other locations.

Referring to FIG. 5, in this embodiment, the semiconductor device 300 has structures similar to the semiconductor device 100 of FIG. 1. However, the continuous diffusion region 101 includes only one fin 102. Although a fin 102 is used as an example of a continuous diffusion region 101, other single diffusion region structures may be used.

Referring to FIG. 6, in this embodiment, the semiconductor device 400 has structures similar to the semiconductor device 100 of FIG. 1. However, in this embodiment, the contact 120 is used instead of the contact 112 of FIG. 1. In particular, the contact 120 has a two-dimensional shape. That is, the contact 120 is not merely a structure that extends in one direction 131, but also extends in a second direction 132. Here, the first direction 131 is a direction substantially parallel with the isolation gate structure 110 while the second direction 132 is a direction that is substantially perpendicular to the first direction 131. Both directions 131 and 132 may be substantially parallel to a surface of the substrate.

In this embodiment, the contact 120 includes a portion 120a that extends towards the isolation gate contact 114 in direction 132. As a result, the isolation gate contact 114 may have a smaller width, such as having a having a shorter length in the second direction 132, i.e. perpendicular to the isolation gate structure 110. Thus, a chance of the contact 114 inadvertently becoming electrically connected to the diffusion region 109 may be further reduced.

Moreover, another portion 120b of the contact 120 may be substantially similar to other contacts, such as contact 108. As a result, a spatial margin associated with the contact 120 may be similar to the other contacts, except for portion 120a, where a contact to an adjacent structure, such as the isolation gate contact 114, is intentional.

Figure 7A:
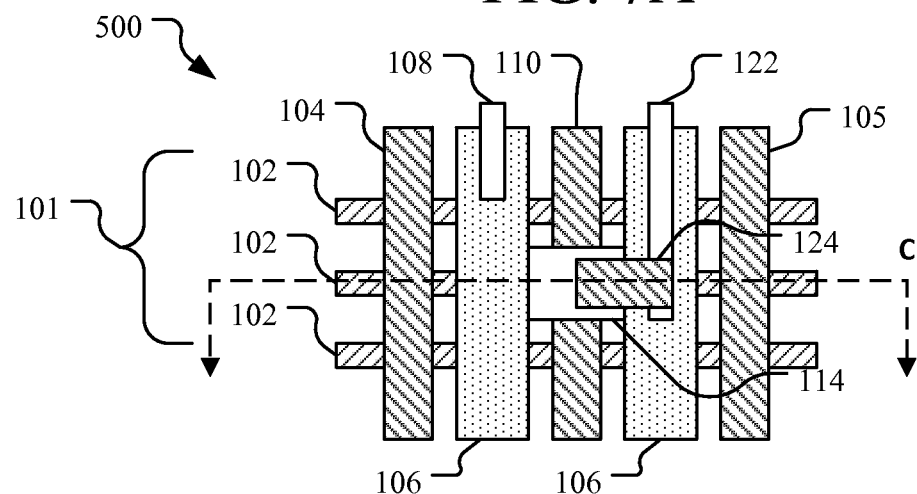
FIG. 7A is a plan view of a semiconductor device according to another embodiment.
Figure 7B:
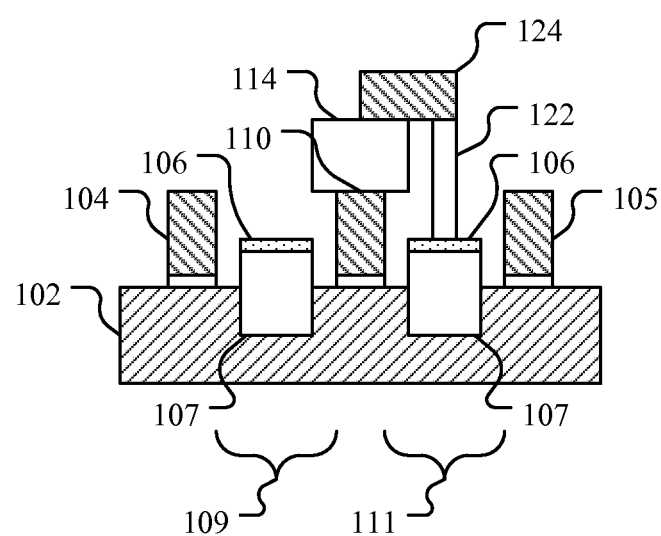
FIG. 7B is a cross-sectional view of the semiconductor device of FIG. 6A.

FIG. 7A is a plan view of a semiconductor device according to another embodiment. FIG. 7B is a cross-sectional view of the semiconductor device of FIG. 7A along plane C. Referring to FIGS. 7A and 7B, in this embodiment, the semiconductor device 500 has structures similar to the semiconductor device 100 of FIG. 1. However, in this embodiment, the contact 122 is used instead of the contact 112 of FIG. 1. In particular, the contact 122 does not directly contact isolation gate contact 114. In contrast, a interconnect layer including an interconnect 124 is used to electrically connect the isolation gate contact 114 to the contact 122.

Figure 8A:
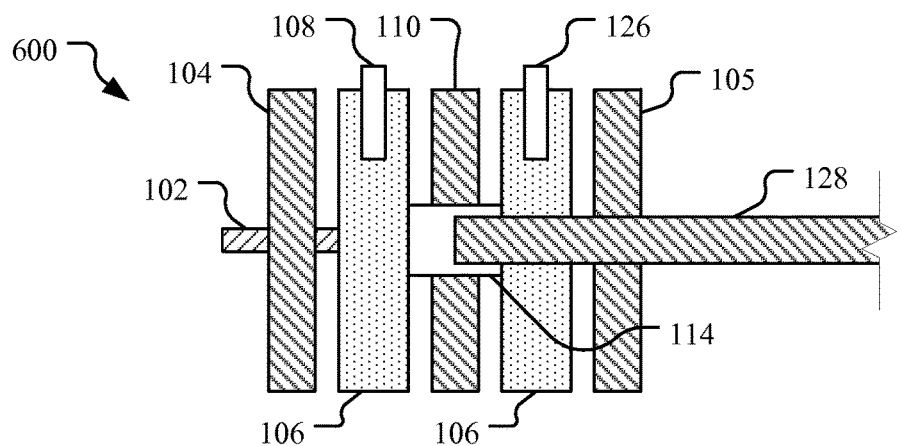
FIGS. 8A and 8B are plan views of semiconductor device according to various embodiments.
Figure 8B:
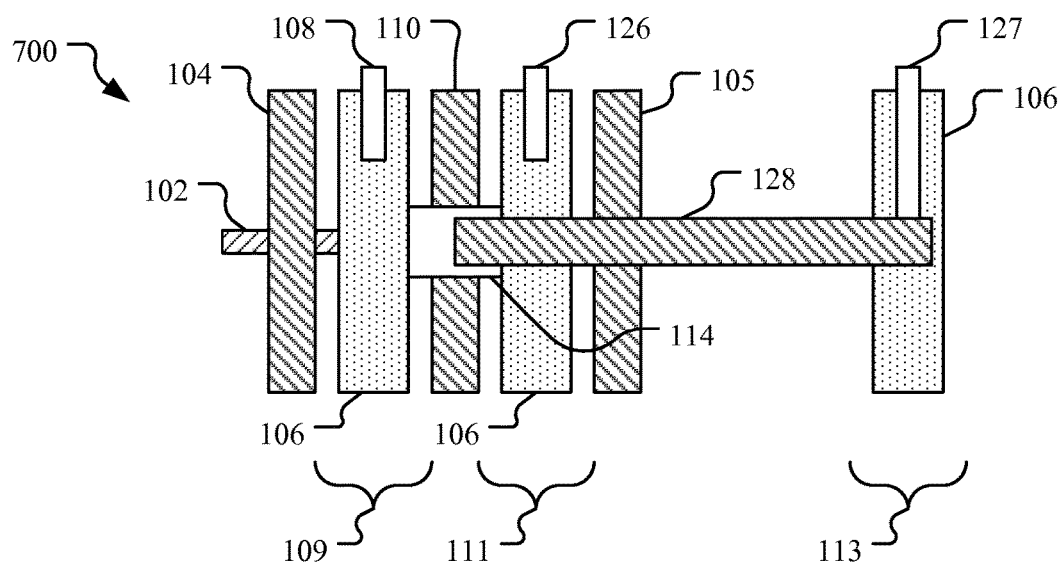

FIGS. 8A and 8B are plan views of semiconductor device according to various embodiments. Referring to FIG. 8A, in this embodiment, the semiconductor device 600 has structures similar to the semiconductor device 500 of FIG. 7A. However, in this embodiment, the contact 126 is used instead of the contact 122. The contact 126 is not electrically connected to the isolation gate contact 114. For example, the contact 126 may be similar to the contact 108, such as by extending only partially over the diffusion regions 109 and 111. As a result, the isolation gate structure 110 is electrically insulated from both adjacent diffusion regions 109 and 111.

In addition, the interconnect 128 is used instead of the interconnect 124 of FIG. 7A. In particular, the interconnect 128 extends to another portion of the semiconductor device 600 where the interconnect 128 is electrically connected to a voltage to bias the isolation gate structure 110. In an embodiment, the interconnect 128 may merely extend to an adjacent cell, circuit or the like; however, the interconnect 128 may extend any distance and may also be connected to other gate structures similar to isolation gate structure 110.

Referring to FIG. 8B, in this embodiment, the semiconductor device 700 has structures similar to the semiconductor device 600 of FIG. 8A. However, here, the interconnect 128 is electrically connected to a contact 127 for another, distant diffusion region 113. The diffusion region 113 may be in the same cell or an adjacent cell, the next cell with a connection to an appropriate voltage, or the like.

Figure 9:
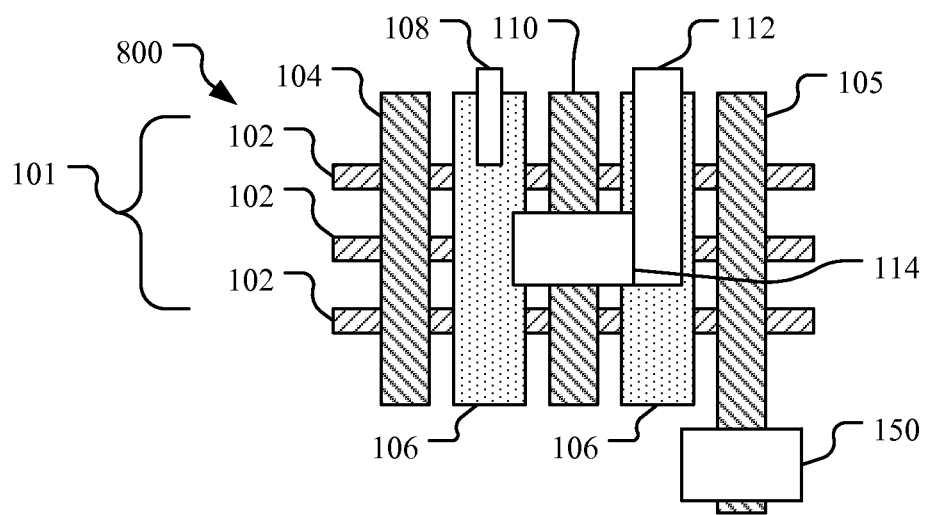
FIG. 9 is a plan view of a semiconductor device according to another embodiment.

Referring to FIG. 9, in this embodiment, the semiconductor device 800 has structures similar to the semiconductor device 100 of FIG. 1. However, a signal gate contact 150 is also illustrated. The signal gate contact 150 is disposed on the gate structure 105 to allow contact to the gate structure 105. In an embodiment, the signal gate contact 150 and the isolation gate contact 114 may have substantially the same structure. Accordingly, additional processing may not be needed to form the isolation gate structure 114. In another embodiment, the isolation gate contact 114 may be elongated relative to the signal gate contact 150. For example, the isolation gate contact 114 may be longer than the signal gate contact 150 in a direction perpendicular to a direction in which the isolation gate structure 110 extends.

Figure 10:
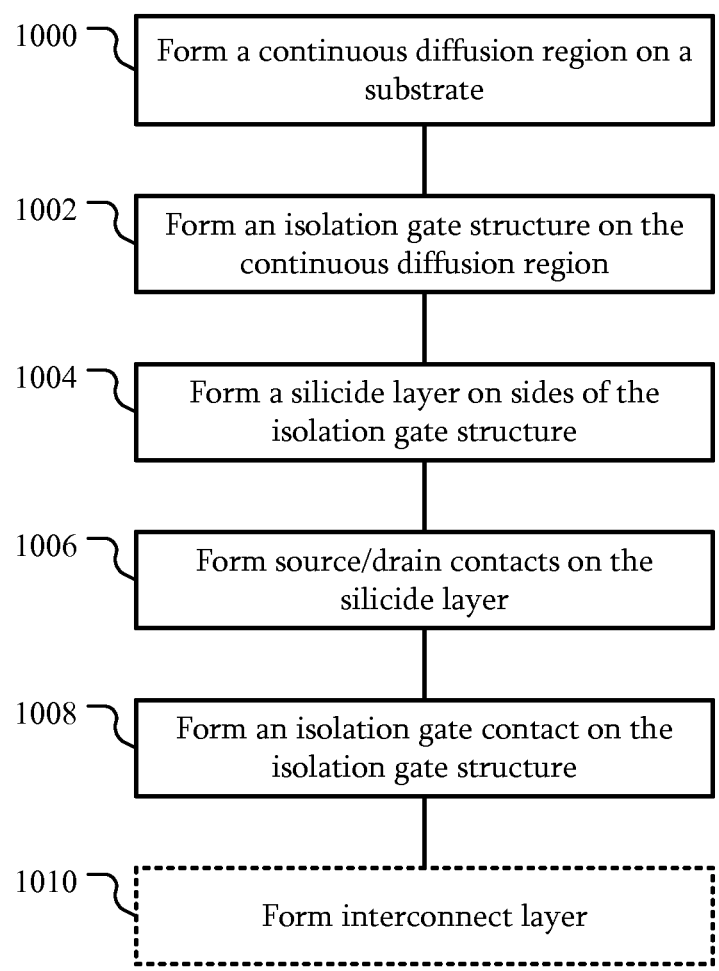
FIG. 10 is a flowchart illustrating a technique of forming a semiconductor device according to an embodiment.

FIG. 10 is a flowchart illustrating a technique of forming a semiconductor device according to an embodiment. In this embodiment, in 1000, a continuous diffusion region is formed on a substrate. In 1002, an isolation gate structure is formed on the continuous diffusion region. In 1004, a silicide layer is formed on sides of the isolation gate structure. The silicide layer may be a blanket silicide layer that results in a salicide structure over source/drain regions of the continuous diffusion region. In 1006, source/drain contacts are formed on the silicide layer. In 1008, an isolation gate contact is formed on the isolation gate structure.

Using such a technique, structures as described herein may be formed. For example, forming the source/drain contacts and the isolation gate contact in 1006 and 1008 may result in an electrical connection between one of the source/drain contacts and the isolation gate contact.

In 1010, an interconnect layer is formed. The interconnect layer may include interconnects that electrically connect the isolation gate contact to a source/drain contact. For example, as described above, the interconnect may electrically connect the isolation gate contact to an adjacent source/drain contact, a distant source/drain contact, or the like.

Figure 11:
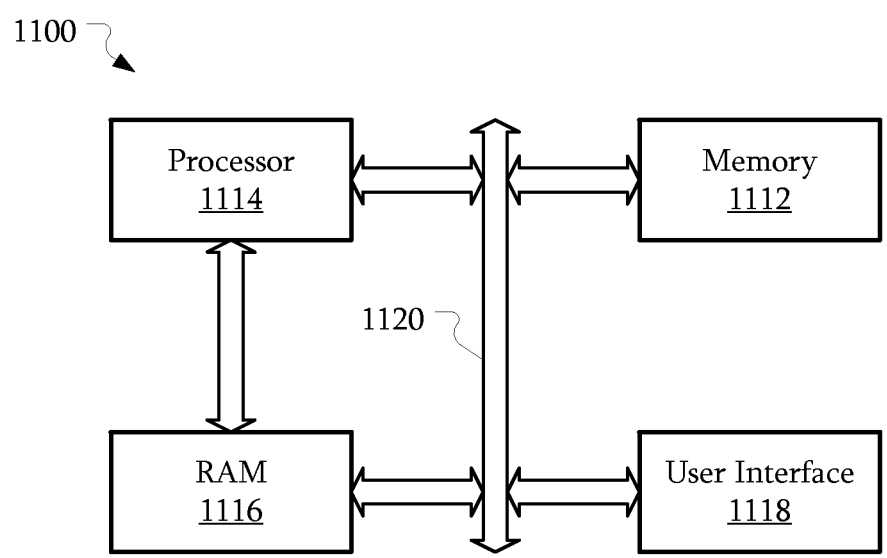
FIG. 11 is a schematic view of an electronic system which may include a semiconductor device according to an embodiment.

FIG. 11 is a schematic view of an electronic system which may include a semiconductor device according to an embodiment. The electronic system 1100 may be part of a wide variety of electronic devices including, but not limited to portable notebook computers, Ultra-Mobile PCs (UMPC), Tablet PCs, servers, workstations, mobile telecommunication devices, and so on. For example, the electronic system 1100 may include a memory system 1112, a processor 1114, RAM 1116, and a user interface 1118, which may execute data communication using a bus 1120.

The processor 1114 may be a microprocessor or a mobile processor (AP). The processor 1114 may have a processor core (not illustrated) that can include a floating point unit (FPU), an arithmetic logic unit (ALU), a graphics processing unit (GPU), and a digital signal processing core (DSP Core), or any combinations thereof. The processor 1114 may be configured to execute the program and control the electronic system 1100.

The RAM 1116 may be used as an operation memory of the processor 1114. Alternatively, the processor 1114 and the RAM 1116 may be packaged in a single package body.

The user interface 1118 may be used in inputting/outputting data to/from the electronic system 1100. For example, the user interface 1118 may include a touch screen, keyboard, network interface, pointing device, audio device, haptic device, or the like.

The memory system 1112 may store codes for operating the processor 1114, data processed by the processor 1114, or externally input data. The memory system 1112 may include a controller and a memory. The memory system may include an interface to computer readable media. Such computer readable media may store instructions to perform the variety of operations describe above.

Although the device, methods, and systems have been described in accordance with particular embodiments, one of ordinary skill in the art will readily recognize that many variations to the disclosed embodiments are possible, and any variations should therefore be considered to be within the spirit and scope of the devices, methods, and systems disclosed herein. Accordingly, many modifications may be made by one of ordinary skill in the art without departing from the spirit and scope of the appended claims.

The invention claimed is:
1. A semiconductor device, comprising:
a substrate;
a continuous diffusion region disposed on the substrate, wherein the continuous diffusion region includes a plurality of fins each of which is extended in a first direction and which are separated from each other in a second direction crossing the first direction,
wherein the continuous diffusion region includes a first diffusion region and a second diffusion region;
a first gate structure disposed on the continuous diffusion region and extended in the second direction;
a second gate structure disposed on the continuous diffusion region and extended in the second direction;
an isolation gate structure disposed between the first gate structure and the second gate structure and extended in the second direction with a uniform width measured in the first direction,
wherein the first diffusion region is disposed between the first gate structure and the isolation gate structure, and
wherein the second diffusion region is disposed between the second gate structure and the isolation gate structure;
a first source/drain disposed in the first diffusion region, wherein a top surface of the first source/drain is higher than a top surface of the continuous diffusion region;
a second source/drain disposed in the second diffusion region;
a first conductive layer disposed on the first source/drain;
a second conductive layer disposed on the second source/drain;

an isolation gate contact disposed over the isolation gate structure and electrically insulated from the first source/drain, wherein the isolation gate contact extends beyond either sidewalls of the isolation gate structure toward the first source/drain and the second source/drain; and a source/drain contact being in contact with the second conductive layer, wherein the source/drain contact is electrically connected to the isolation gate contact, wherein a top surface of the isolation gate contact and a top surface of the source/drain contact are disposed at substantially the same height from a top surface of the continuous diffusion region, and wherein the isolation gate structure electrically connected to the second source/drain through the isolation gate contact and the source/drain contact, wherein the isolation gate structure has a higher threshold voltage than a threshold voltage of the first gate structure or a threshold voltage of the second gate structure, and wherein a bottom surface of the isolation gate contact is higher than a bottom surface of the source/drain contact.

2. The semiconductor device of claim 1,
wherein the source/drain contact comprises a portion extending towards the isolation gate contact.

3. The semiconductor device of claim 1,
wherein the source/drain contact is electrically connected to the isolation gate contact through an interconnect layer.

4. The semiconductor device of claim 3,
wherein the source/drain contact is electrically insulated from the second diffusion region.

5. The semiconductor device of claim 1, further comprising a signal gate contact electrically connected to the first gate structure, wherein the signal gate contact and the isolation gate contact have substantially the same structure.

6. The semiconductor device of claim 1,
wherein a pitch of the first gate structure and the second gate structure is substantially equal to a contacted poly pitch of the semiconductor device.

7. The semiconductor device of claim 1,
wherein the top surface of the continuous diffusion region is lower than a top surface of the second source/drain.

8. The semiconductor device of claim 1,
wherein the continuous diffusion region is extended in a first direction, wherein the first diffusion region and the second diffusion region are arranged along the first direction, wherein the isolation gate contact is extended across a portion of the isolation gate structure in parallel to the first direction so that the portion of the isolation gate structure has a width substantially the same as a width of the isolation gate structure.

9. The semiconductor device of claim 8,
wherein the isolation gate contact is in contact with a sidewall of the source/drain contact.

* * * * *